US012328846B2

United States Patent
Yu et al.

(10) Patent No.: US 12,328,846 B2
(45) Date of Patent: Jun. 10, 2025

(54) ELASTIC HEAT CONDUCTION MECHANISM FOR ELECTRONIC DEVICES

(71) Applicant: ADLINK TECHNOLOGY INC., Taoyuan (TW)

(72) Inventors: Hsiu-Ling Yu, Taoyuan (TW); Milo Li, Taoyuan (TW); Hsuan-Chan Chiang, Taoyuan (TW)

(73) Assignee: ADLINK TECHNOLOGY INC., Taoyuan (TW)

( * ) Notice: Subject to any disclaimer, the term of this patent is extended or adjusted under 35 U.S.C. 154(b) by 357 days.

(21) Appl. No.: 18/174,459

(22) Filed: Feb. 24, 2023

(65) Prior Publication Data
US 2024/0292570 A1    Aug. 29, 2024

(51) Int. Cl.
*H05K 7/20*    (2006.01)

(52) U.S. Cl.
CPC ..... *H05K 7/20454* (2013.01); *H05K 7/20418* (2013.01)

(58) Field of Classification Search
CPC .. F28F 2275/18; H01L 23/40; H01L 23/4006; H01L 23/4093; H01L 23/4338; H05K 7/20418; H05K 7/20454
See application file for complete search history.

(56) References Cited

U.S. PATENT DOCUMENTS

| | | | | |
|---|---|---|---|---|
| 3,971,186 | A * | 7/1976 | Havelka | H05K 7/1404 403/409.1 |
| 4,908,695 | A * | 3/1990 | Morihara | H01L 23/4338 361/679.02 |
| 6,480,386 | B1 * | 11/2002 | Yu | H01L 23/4093 165/185 |
| 7,480,143 | B2 * | 1/2009 | Delano | H01L 23/4338 257/713 |
| 9,025,342 | B2 * | 5/2015 | Harvey | H05K 7/1404 361/801 |
| 9,167,714 | B2 * | 10/2015 | Paquette | H05K 7/20545 |
| 9,466,551 | B1 * | 10/2016 | Reist | F28D 15/0241 |
| 2005/0047092 | A1 * | 3/2005 | Whit | H01L 23/4338 361/704 |
| 2009/0229808 | A1 * | 9/2009 | Chu | H05K 7/2049 165/185 |
| 2016/0084590 | A1 * | 3/2016 | Joist | H01L 23/4338 165/86 |
| 2017/0363371 | A1 * | 12/2017 | David | F28F 5/00 |
| 2023/0108232 | A1 * | 4/2023 | Lyon | G01N 25/72 374/45 |

* cited by examiner

*Primary Examiner* — Len Tran
*Assistant Examiner* — Hans R Weiland

(57) ABSTRACT

An elastic heat conduction mechanism for electronic devices includes a heat-conducting unit and a heat-exchanging member that are tightly assembled in an elastic and floating docking adjustment to achieve the effect of preset heating element cooling. The base and heat-conducting assembly of the heat-conducting unit are floatingly assembled in the storage space of the heat-exchanging member to form a floating adjustment and a stable fit to assist the preset heating element to quickly dissipate heat.

9 Claims, 7 Drawing Sheets

ELASTIC HEAT CONDUCTION MECHANISM FOR ELECTRONIC DEVICES

BACKGROUND OF THE INVENTION

1. Field of the Invention

The present invention relates to heat conduction technology and more particularly, to an elastic heat conduction mechanism for electronic devices, which comprises a heat-conducting unit and a heat-exchanging member that closely fit each other for rapid conduction of heat. The base and heat-conducting assembly of the heat-conducting unit are floatingly assembled in the storage space of the heat-exchanging member to form a floating adjustment and a stable fit to assist the preset heating element to quickly dissipate heat.

2. Description of the Related Art

With the continuous advancement of electronic technology, the development and advent of many electronic and electrical products provide people with different living and working modes in the living and working environment through various electronic and electrical products. Among all kinds of electronic and electrical products, computers or mobile electronic products are the most closely related to life and work. Various types of computers, such as desktop computers, notebook computers, tablet computers or personal digital assistants (PDAs), are also the most commonly used and most frequently used electronic and electrical products. In this type of computer or electronic and electrical products, hard disks (SSD, HDD), chips, circuit boards, interface cards, etc., and various electronic components installed in them will generate heat during application and operation. The heat generated must be removed quickly to avoid affecting the normal operation of various electronic and electrical products. For the heat sources in various electronic and electrical products, such as the central processing unit (CPU), microprocessor, chip or hard disk (SSD, HDD) used on the circuit board of various electronic and electrical products, due to the influence of factors such as assembly method, assembly location, and surrounding space, common removable hard disk (SSD, HDD) storage devices, etc., cannot implement an effective heat conduction system. Some removable hard drives (SSD, HDD) and other storage devices use thermal pads as heat conduction and cooling systems. However, its heat conduction and heat dissipation effects are not good, and the use of fixed thermal pads makes it difficult to replace or repair storage devices such as removable hard drives (SSD, HDD). The wedge lock of the conduction cooling mechanism used in general electronic products (cPCI, VPX) must reserve a space for installing the wedge lock on the circuit board, and it is necessary to adjust the movement of each wedge block of the wedge lock through external force (such as: screw rotation or manual pull rod, etc.). Because the contact area between each wedge block of the wedge lock is small, the heat conduction efficiency is low (high thermal resistance), and the heat dissipation effect is not good.

Currently heat conduction mechanisms used in various electronic devices for auxiliary heat dissipation, due to poor heat conduction efficiency and unsatisfactory heat dissipation effect, it is easy to affect the abnormal operation or failure of the heat source of the electronic device, which will lead to the overall poor operation of the electronic device.

Therefore, how to solve the problems and troubles that the heat dissipation effect of the heat source of the current electronic device is not ideal, and the auxiliary heat dissipation objects or mechanisms used cannot effectively assist the trouble and lack of rapid heat dissipation of the heat source, it is the direction that relevant manufacturers engaged in this industry are eager to study and improve.

SUMMARY OF THE INVENTION

In view of the above-mentioned problems and deficiencies, the inventor collected relevant information, evaluated and considered in many ways, and based on years of experience accumulated in this industry, through continuous creation and modification, he designed this elastic heat conduction device for electronic devices.

It is therefore one object of the present invention to provide an elastic heat conduction mechanism for electronic devices, which comprises a heat-conducting unit and a heat-exchanging member. The heat-conducting unit comprises a base, an accommodating space defined on one side of the base to accommodate a preset heating element, a heat conduction space defined on an opposite side of the base opposite to the accommodating space, at least one heat-conducting assembly assembled in the heat conduction space and at least one pair of opposite wedge seats arranged inside the heat conduction space. Each heat-conducting assembly comprises two relative fixed seats assembled on two opposite sides of the wedge seats, two opposite wedges movably erected between the fixed seats, a plurality of lifting adjustment members respectively arranged at two sides of the wedges and respectively affixed to the fixed seats for the wedges to be respectively attached to the wedge seats in a floating manner, and at least one elastic member set between the wedges to isolate the relative inner side of the wedges to form an adjustment space. The heat-exchanging member has a storage space defined on one side thereof where the heat-conducting unit is assembled, and a plurality of fins provided on the other side opposite to said storage space. The heat-conducting unit and the heat-exchanging member are tightly assembled in an elastic and floating docking adjustment to achieve the effect of preset heating element cooling.

It is another object of the present invention to provide an elastic heat conduction mechanism for electronic devices, wherein the base of the heat-conducting unit has two guide rails respectively provided on two opposite outer sides thereof, and the heat-exchanging member has two chutes respectively provided on two opposite side walls of the storage space and respectively slidably coupled with the guide rails. The base of the heat-conducting unit is in H shape. Each wedge seat arranged inside the heat conduction space of the base comprises two opposite seat bodies, and the two seat bodies have opposite inner sides thereof respectively provided with an inclined fitting surface. The wedges of each heat-conducting assembly assembled on the wedge seats are respectively in the shape of an inverted triangle. Each wedge has an abutment surface located on an outer surface thereof and abutted to the inclined fitting surface of one respective seat body in a floatable manner to creates a tight fit with a large contact area. The lifting adjustment members are respectively arranged at two sides of the wedges and respectively affixed to the fixed seats. The lifting adjustment members are selectively springs, torsion springs, coil springs, reeds or hook rods with elastic force.

It is still another object of the present invention to provide an elastic heat conduction mechanism for electronic devices, wherein the wedges of the at least one heat-conducting assembly are respectively in the shape of an inverted triangle. Each wedge has a horizontal butt joint surface located on the top thereof for the top surface of the storage space of the heat-exchanging member to float and support and fit, thereby forming a larger contact area to achieve rapid heat transfer.

It is still another object of the present invention to provide an elastic heat conduction mechanism for electronic devices, wherein the fixed seats each are respectively provided with at least one positioning post and at least one fixing piece, and the heat conduction space of the base has the surface thereof provided with a plurality of positioning holes and fixing holes, which are used for embedding and fixing of the positioning posts and the fixing pieces of the fixed seats. The positioning posts and positioning holes and the fixing pieces and fixing holes are respectively selectively tip rods and tip holes, or tenons and mortise holes, or screw rods and screw holes.

It is still another object of the present invention to provide an elastic heat conduction mechanism for electronic devices, wherein the preset heating element accommodated in the accommodating space of the base can be an access device (such as SSD or HDD hard disk, etc.), central processing unit (CPU), chip or microprocessor inside the preset electronic device (such as: industrial computer case, server or desktop computer host).

It is still another object of the present invention to provide an elastic heat conduction mechanism for electronic devices, wherein the heat-exchanging member can be a heat sink or the housing of the preset electronic device. When the heat-exchanging member is a heat sink, a plurality of fins can be provided on the other side of the heat-exchanging member relative to the storage space. The heat-exchanging member can also be a metal casing of a predetermined electronic device, such as: an industrial computer case, or a metal casing of a server or a desktop computer host.

DETAILED DESCRIPTION OF THE PREFERRED EMBODIMENT

In order to achieve the above-mentioned purpose and effect, the technical means adopted in the present invention, its structure, and the method of implementation, etc., are hereby drawn in detail to illustrate the features and functions of the preferred embodiment of the present invention as follows, so as to facilitate a complete understanding.

Figure 1:
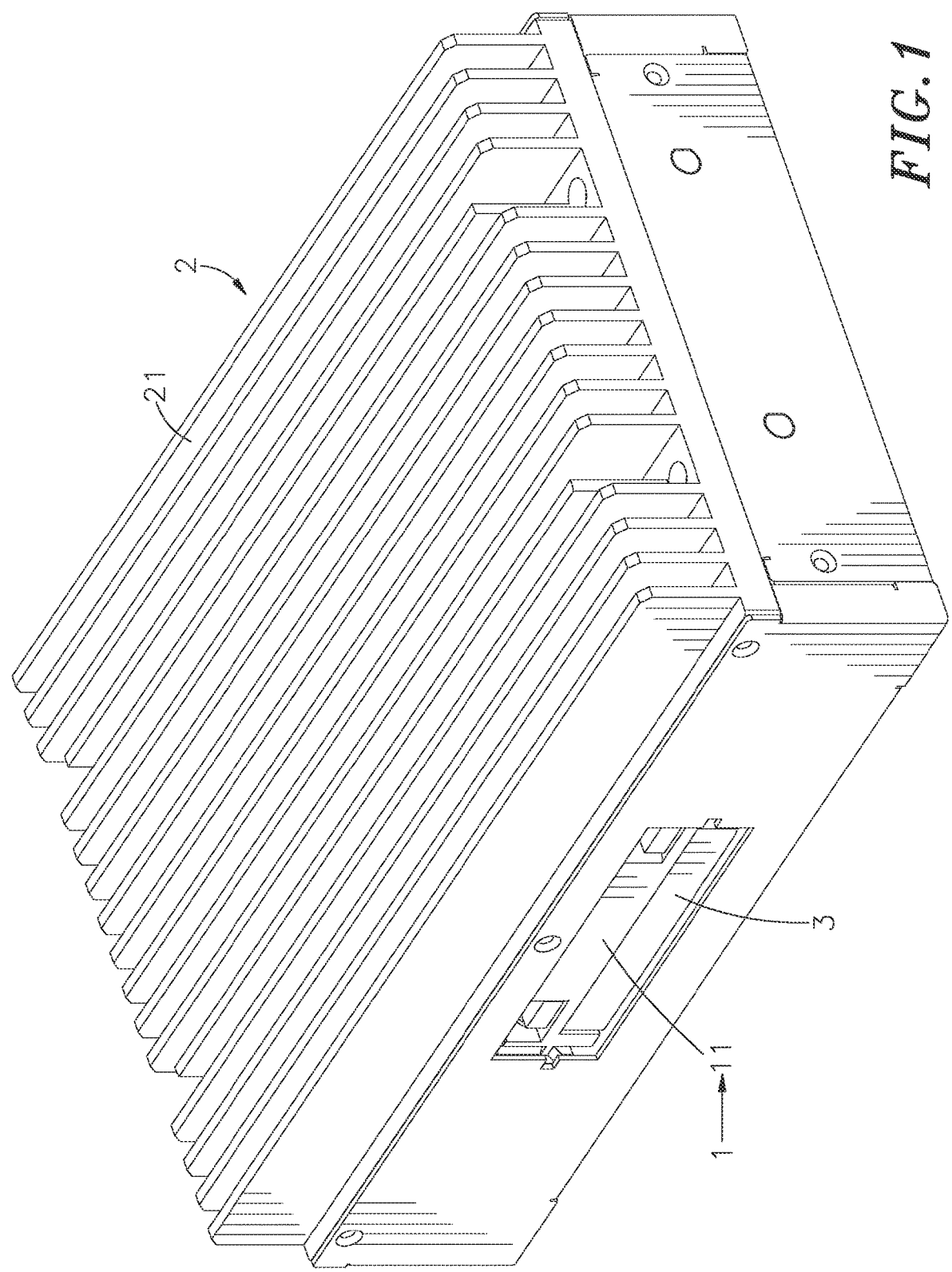
FIG. 1 is an oblique top elevational view of the present invention.
Figure 2:
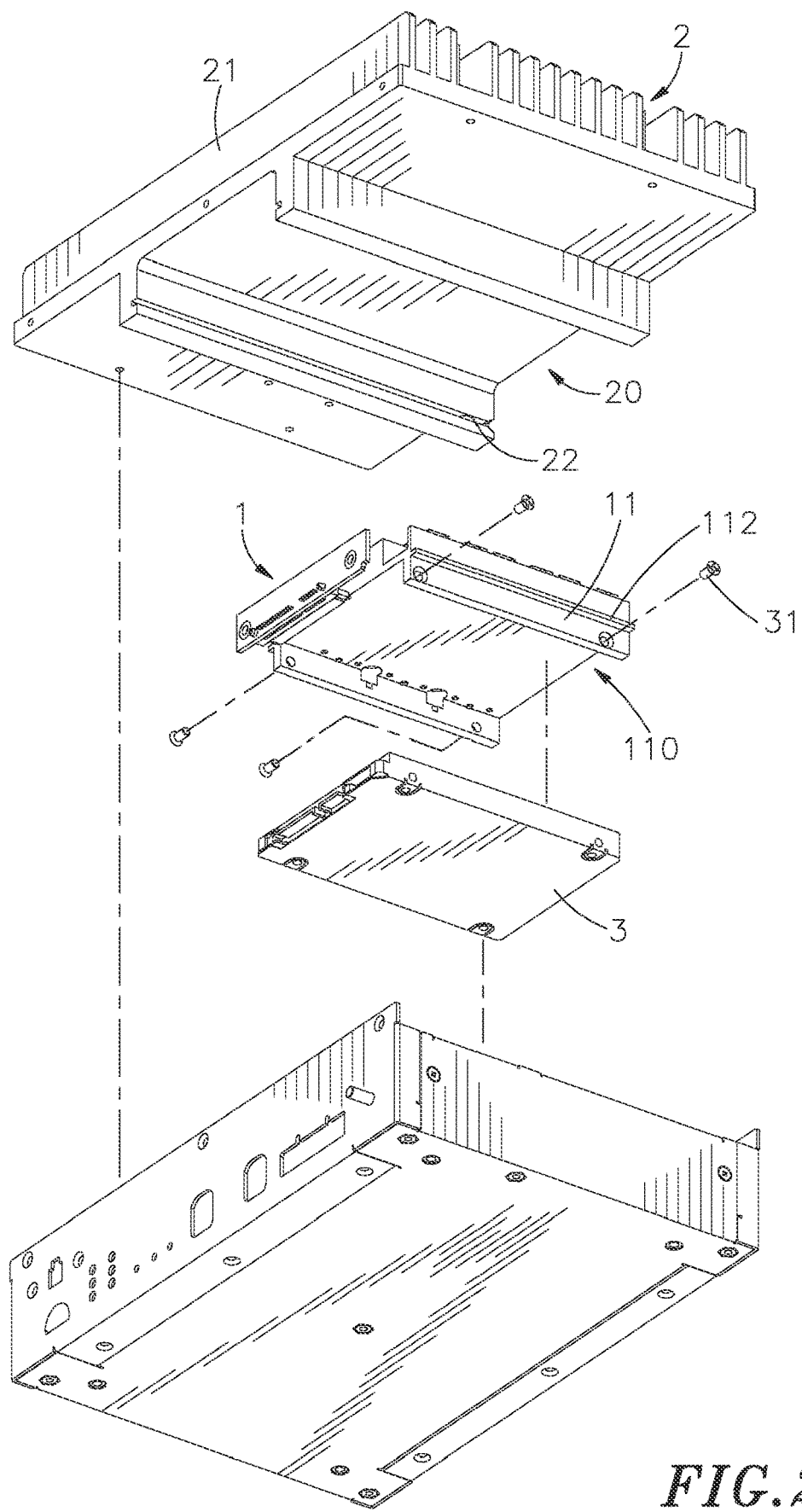
FIG. 2 is a three-dimensional exploded view of the present invention.
Figure 3:
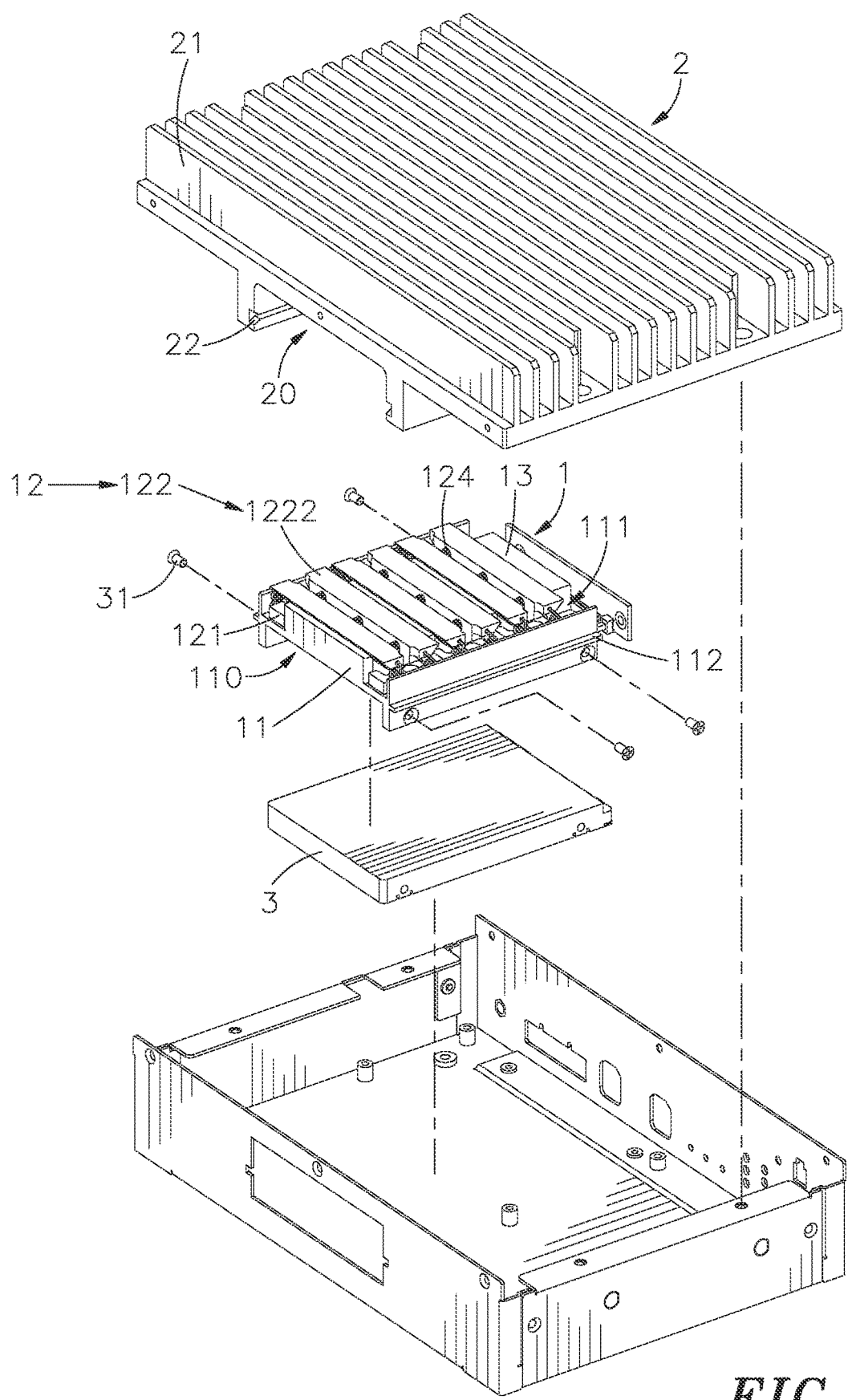
FIG. 3 is a three-dimensional exploded view of another perspective of the present invention.
Figure 4:
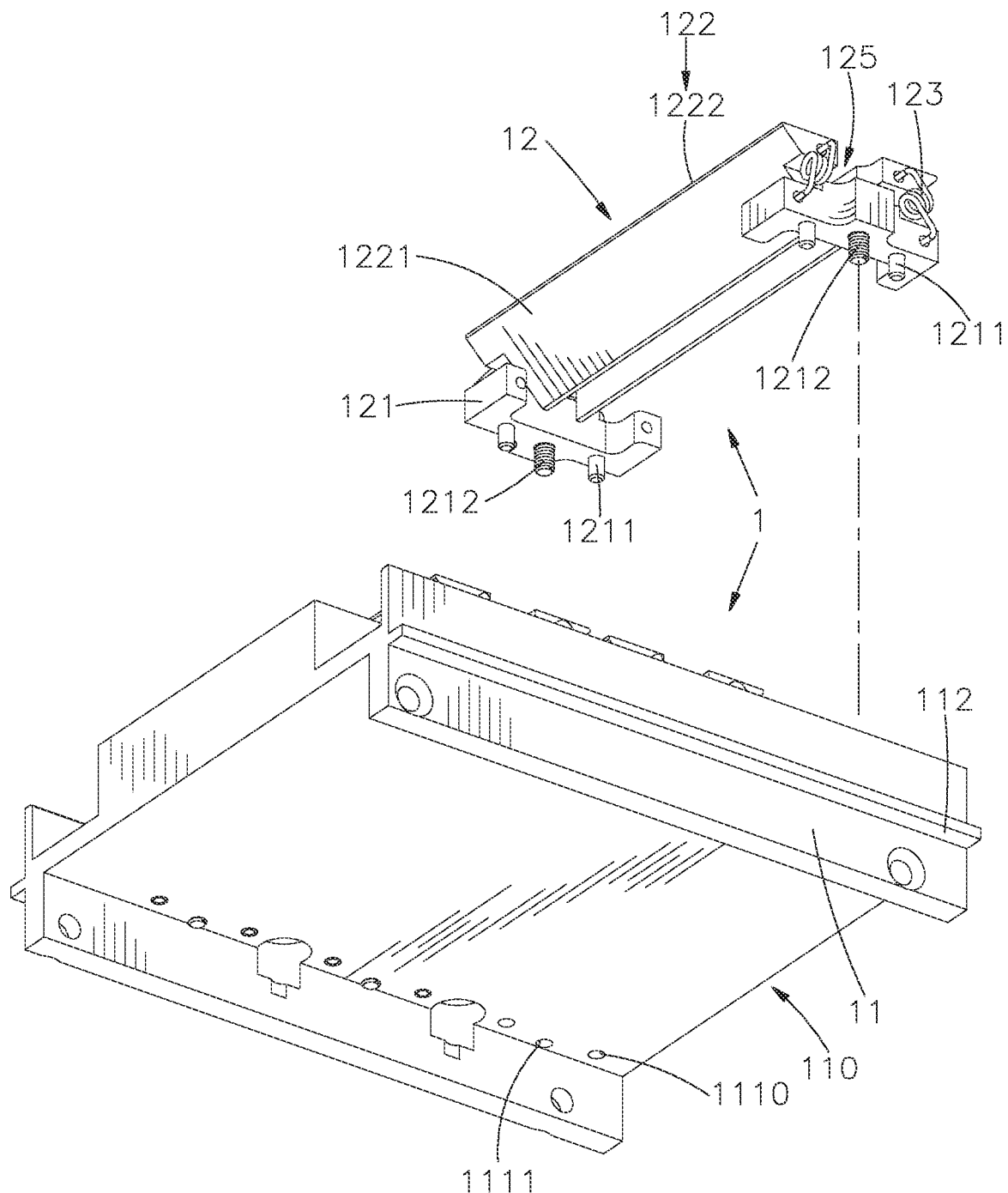
FIG. 4 is a three-dimensional exploded view of the heat-conducting unit of the present invention.
Figure 5:
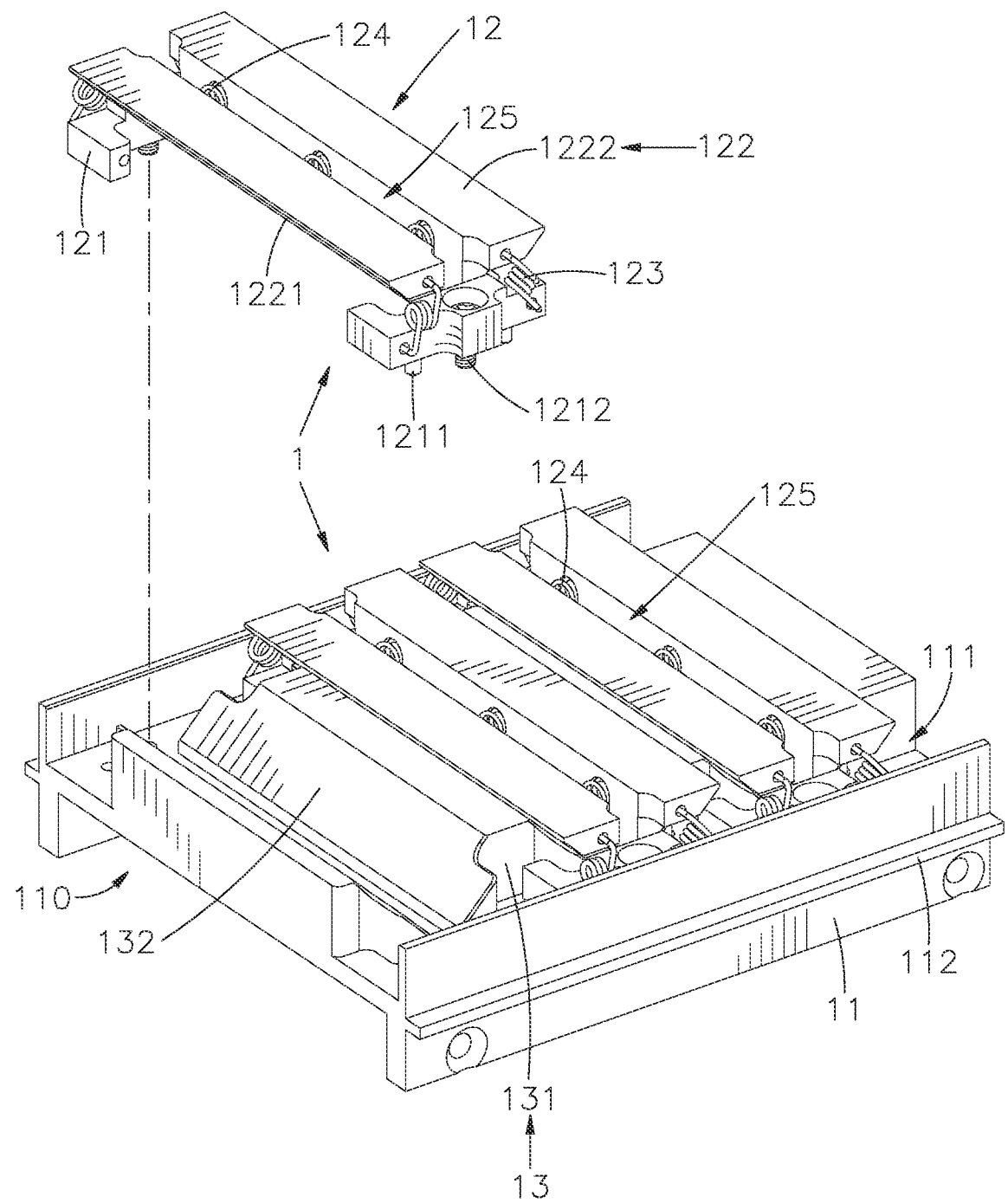
FIG. 5 is an exploded view of the heat-conducting unit of the present invention from another perspective.
Figure 6:
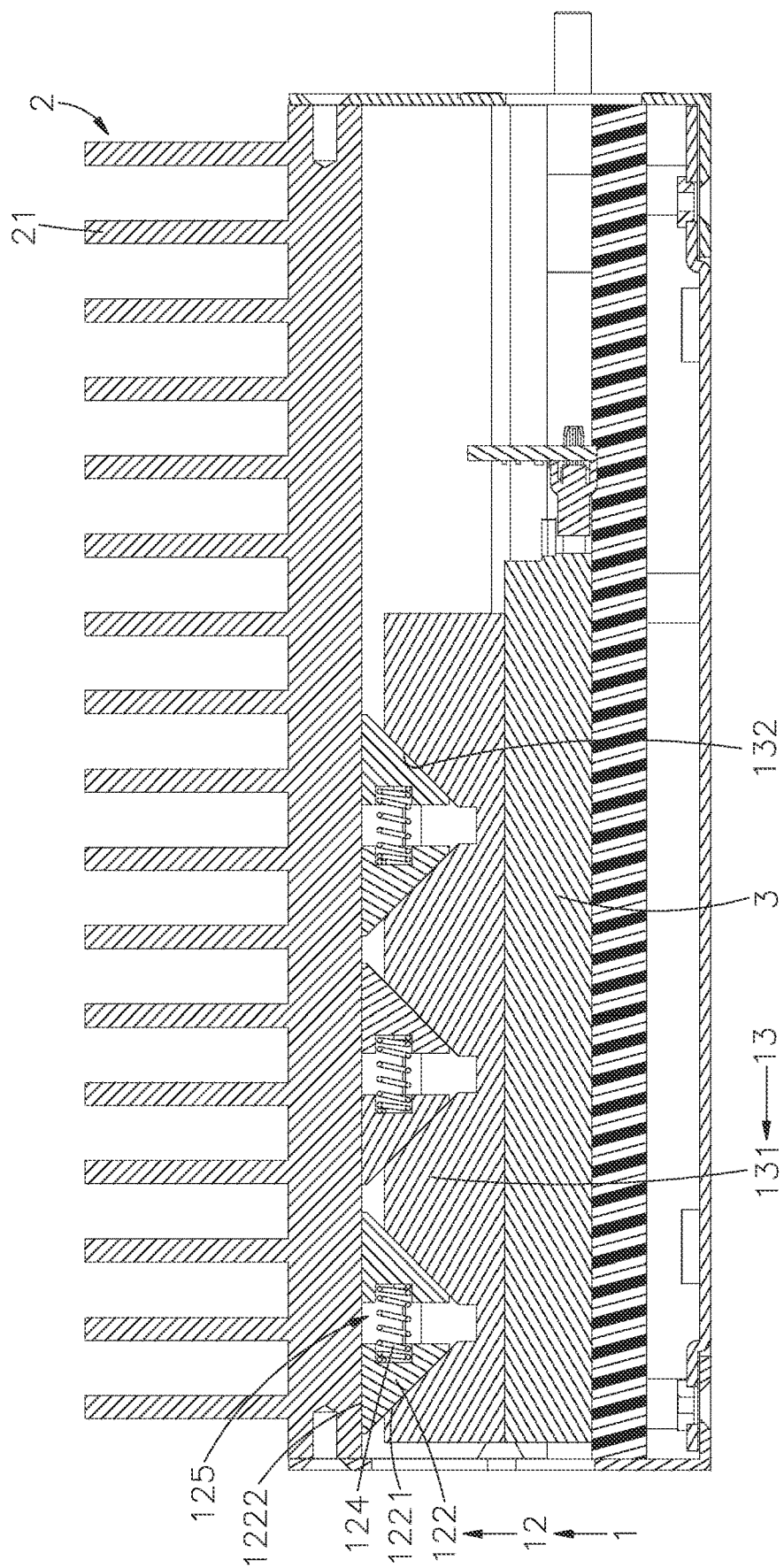
FIG. 6 is a side sectional view of the present invention (I).
Figure 7:
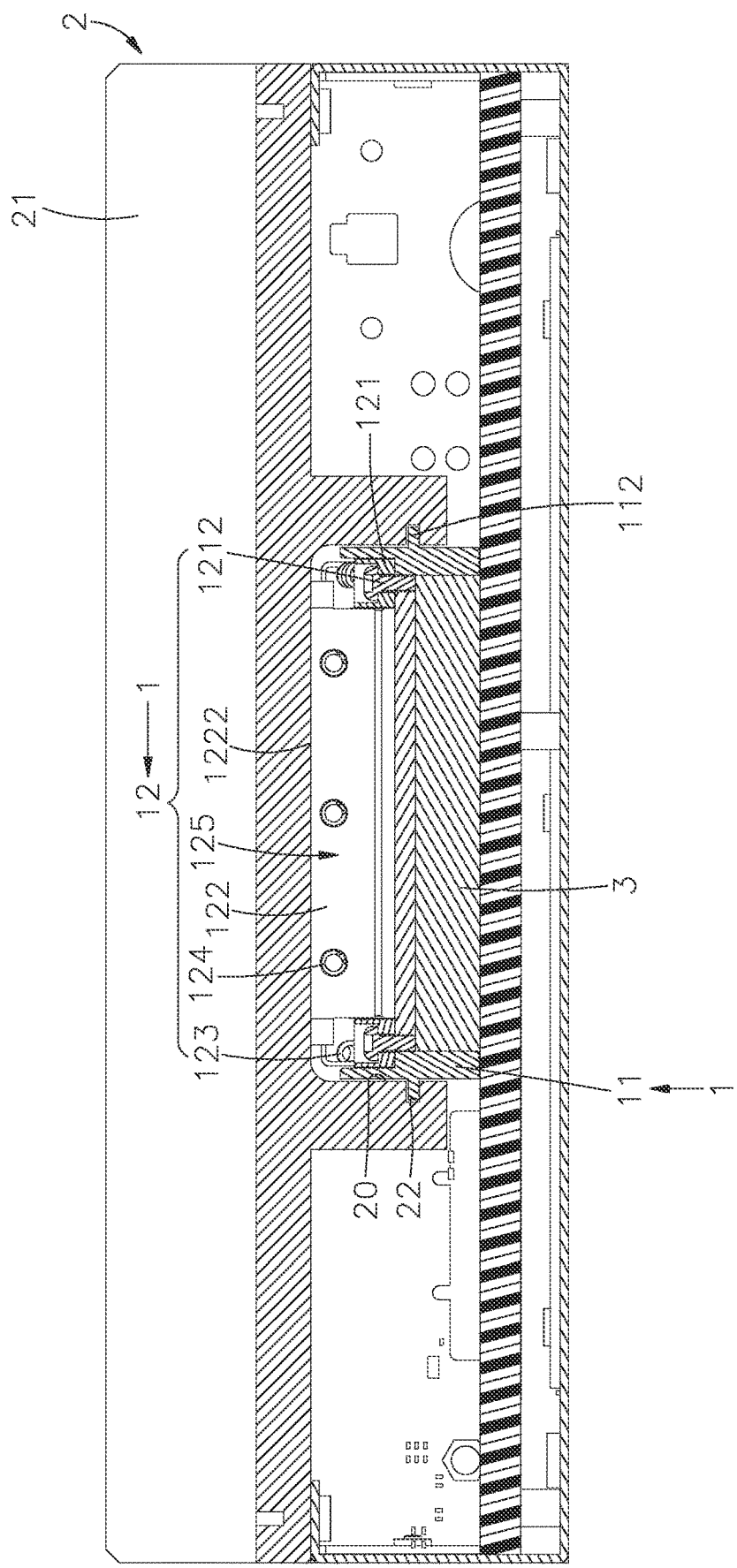
FIG. 7 is a side sectional view of the present invention (II)

Please refer to FIGS. 1-7, which are the oblique top elevational view, the three-dimensional exploded view, the three-dimensional exploded view of another perspective, the three-dimensional exploded view of the heat-conducting unit, the exploded view of the heat-conducting unit from another perspective, the side sectional view (I) and the side sectional view (II) of the present invention. As shown in the drawings, it can be clearly seen that the elastic heat conduction mechanism of the present invention applied to electronic devices comprises a heat-conducting unit 1 and a heat-exchanging member 2.

The heat-conducting unit 1 comprises a base 11, which defines an accommodating space 110 on its one side for accommodating the preset heating element 3 and a heat conduction space 111 on its other side opposite to the accommodating space 110, at least one heat-conducting assembly 12 assembled in the heat conduction space 111, and at least one pair of opposite wedge seats 13 arranged inside the heat conduction space 111. The heat-conducting assembly 12 comprises two relative fixed seats 121 assembled on two opposite outer sides of the at least one pair of opposite wedge seats 13, two opposite wedges 122 movably erected between the two fixed seats 121, a plurality of lifting adjustment members 123 respectively arranged at the two sides of the wedges 122 and respectively affixed to the fixed seats 121 for the wedges 122 to be respectively attached to the wedge seats 13 in a floating manner, at least one elastic member 124 set between the wedges 122 to isolate the relative inner side of the wedges 122 to form an adjustment space 125.

One side of the heat-exchanging member 2 is provided with a storage space 20 for assembling the heat-conducting unit 1.

The base 11 of the heat-conducting unit 1 has two guide rails 112 respectively provided on two opposite outer sides thereof. The heat-exchanging member 2 has two chutes 22 respectively provided on two opposite side walls of the storage space 20 and respectively slidably coupled with the guide rails 112 for allowing relative sliding movement of the base 11 and the heat-exchanging member 2. The base 11 of the heat-conducting unit 1 can be in H shape. Each wedge seat 13 arranged inside the heat conduction space 111 of the base 11 of the heat-conducting unit 1. The wedge seat 13 comprises two opposite seat bodies 131, and the opposite inner sides of the two seat bodies 131 are respectively provided with an inclined fitting surface 132. The wedges 122 of the heat-conducting assembly 12 assembled on the wedge seats 13 are respectively in the shape of an inverted triangle, each having an abutment surface 1221 located on an outer surface thereof, which can be floating and abutted to the inclined fitting surface 132 of one respective seat body 131, and a horizontal butt joint surface 1222 located on the top thereof adjacent to the abutment surface 1221. The lifting adjustment members 123 respectively arranged at two sides of the wedges 122 can be springs, torsion springs, coil springs, reeds or hook rods with elastic force. As described above, the lifting adjustment members 123 are respectively arranged at the two sides of the wedges 122 and respectively affixed to the fixed seats 121 for the wedges 122 to be respectively attached to the wedge seats 13 in a floating manner, and the elastic members 124 are set between the wedges 122, and therefore, the two relative wedges 122 are elastically suspended between the two relative fixed seats 121.

The heat-exchanging member 2 mentioned above can be a heat sink or a casing of a preset electronic device. When the heat-exchanging member 2 is a heat sink, a plurality of fins 21 can be provided on the other side of the heat-exchanging member 2 relative to the storage space 20, or it can be a water cooling plate, but the present invention is not limited thereto. The above-mentioned heat-exchanging member 2 can also be a metal casing of a predetermined electronic device, such as: an industrial computer case, or a metal casing of a server or a desktop computer host.

The at least one heat-conducting assembly 12 is assembled in the heat conduction space 111 of the base 11 of the heat-conducting unit 1. The fixed seats 121 are provided with at least one positioning post 1211 and a fixing piece 1212. The surface of the heat conduction space 111 of the base 11 is provided with a plurality of positioning holes 1110 and fixing holes 1111, which can be used for embedding and fixing of the at least one positioning post 1211 and the at least one fixing piece 1212. The at least one positioning post 1211 and the at least one positioning hole 1110 and the at least one fixing piece 1212 and the at least one fixing hole 1111 can be tip rods and tip holes, or tenons and mortise holes, or screw rods and screw holes respectively.

The above-mentioned heat-conducting unit 1 and the heat-exchanging member 2 can accommodate the preset heating element 3 in the accommodating space 110 of the base 11 of the heat-conducting unit 1 during actual application and implementation. The preset heating element 3 can be an access device (such as SSD or HDD hard disk, etc.), central processing unit (CPU), chip or microprocessor inside the preset electronic device (such as: industrial computer case, server or desktop computer host). The base 11 is assembled in the storage space 20 of the heat-exchanging member 2 with the guide rails 112 on the two outer sides of the base 11 respectively embedded in the chutes 22 on both sides of the storage space 20, so that the base 11 and the heat-exchanging member 2 are relatively assembled and combined in a sliding manner. The abutment surfaces 1221 of the wedges 122 of the heat-conducting assemblies 12 at the heat conduction space 111 of the base 11 are respectively supported by the inclined fitting surfaces 132 of the seat bodies 131 of the wedge seats 13, and the horizontal butt joint surfaces 1222 of the wedges 122 are attached to the top surface of the storage space 20 of the heat-exchanging member 2. Thus, between the abutment surfaces 1221 of the wedges 122 and the inclined fitting surfaces 132 of the seat bodies 131 of the wedge seats 13, it is in the form of a tapered sliding contact. Through the lifting adjustment members 123 on both sides of the wedges 122 and the elastic members 124 of the adjustment space 125 on the inner side, elastic displacement and floating docking adjustment in longitudinal, horizontal and oblique directions can be achieved. It can adjust the tightness of butt fit between the abutment surfaces 1221 of the wedges 122 and the inclined fitting surfaces 132 of the seat bodies 131 and between the horizontal butt joint surfaces 1222 and the top surface of the storage space 20 to form a larger contact area, thereby achieving the effect of rapid conduction of heat energy.

In one embodiment, a thermally conductive adhesive (such as thermally conductive silicon film, thermally conductive tape, thermally conductive paste or thermally conductive adhesive, etc.) can also be passed between each horizontal butt joint surface 1222 and the top surface of the storage space 20 to increase the bonding tightness between each horizontal butt joint surface 1222 and the top surface of storage space 20. The heat energy generated by the preset heating element 3 inside the accommodating space 110 of the base 11 can then be transmitted to the heat-exchanging member 2 through the base 11, the wedge seats 13 and the wedges 122 of heat-conducting assembly 12 to dissipate heat and cool down, effectively achieving the purpose of assisting the preset heating element 3 for rapid heat dissipation. Moreover, the wedge seats 13, the wedges 122 and the heat-exchanging member 2 are tightly butted and bonded, which has the effect of rapidly transferring heat energy. In one embodiment, between the abutment surfaces 1221 of the wedges 122 and the inclined fitting surfaces 132 of the wedge seats 13, the bonding tightness between the surfaces can also be increased through thermally conductive thermal paste, so as to achieve the effect of reducing thermal resistance.

In addition, the accommodating space 110 of the base 11 of the heat-conducting unit 1 accommodates the preset heating element 3, and the two opposite sides of the base 11 and the preset heating element 3 can be detachably locked and combined by using multiple fastening members 31. After the storage space 20 of the heat-exchanging member 2 is separated from the base 11, the base 11 can be detached from the top of the preset heating element 3 to facilitate maintenance, testing or replacement of the preset heating element 3.

The above is only a preferred embodiment of the present invention and does not limit the patent scope of the present invention. Therefore, all simple modifications and equivalent structural changes made by using the contents of the description and drawings of the present invention should be included in the patent scope of the present invention in the same way.

To sum up, the above-mentioned elastic heat-conducting member applied to electronic devices of the present invention can truly achieve its effect and purpose when in use. Therefore, this invention is an invention with excellent practicability. In order to meet the requirements of the invention patent application, an application is filed in accordance with the law. I hope that the review committee will approve this case as soon as possible to protect the hard work of the inventor. If the judging committee has any doubts, please don't hesitate to send a letter to instruct, the inventor will try his best to cooperate, thank you very much.

What the invention claimed is:

1. An elastic heat conduction mechanism for electronic devices, comprising:
   a heat-conducting unit, said heat-conducting unit comprising a base, an accommodating space defined on one side of said base to accommodate a preset heating element, a heat conduction space defined on an opposite side of said base opposite to said accommodating space, at least one heat-conducting assembly assembled in said heat conduction space and at least one pair of opposite wedge seats arranged inside said heat conduction space, each said heat-conducting assembly comprising two relative fixed seats assembled on two opposite outer sides of said wedge seats, two opposite wedges movably erected between said fixed seats, a plurality of lifting adjustment members respectively arranged at two sides of said wedges and respectively affixed to said fixed seats for said wedges to be respectively attached to said wedge seats in a floating manner and at least one elastic member set between said wedges to isolate relative inner side of said wedges to form an adjustment space; and
   a heat-exchanging member, said heat-exchanging member comprising a storage space defined on one side thereof where said heat-conducting unit is assembled.

2. The elastic heat conduction mechanism for electronic devices as claimed in claim 1, wherein said base of said heat-conducting unit has two guide rails respectively provided on two opposite outer sides thereof; said heat-exchanging member has two chutes respectively provided on two opposite side walls of said storage space and respectively slidably coupled with said guide rails.

3. The elastic heat conduction mechanism for electronic devices as claimed in claim 1, wherein said base of said heat-conducting unit is in H shape; each said wedge seat arranged inside said heat conduction space of said base comprises two opposite seat bodies, and said two seat bodies having opposite inner sides thereof respectively provided with an inclined fitting surface; said wedges of each said heat-conducting assembly assembled on said wedge seats are respectively in a shape of an inverted triangle, each said wedge having an abutment surface located on an outer surface thereof and abutted to said inclined fitting surface of one respective said seat body in a floatable manner.

4. The elastic heat conduction mechanism for electronic devices as claimed in claim 1, wherein said wedges of said at least one heat-conducting assembly are respectively in a shape of an inverted triangle, each said wedge having a horizontal butt joint surface located on a top thereof for a top surface of said storage space of said heat-exchanging member to float and support and fit.

5. The elastic heat conduction mechanism for electronic devices as claimed in claim 1, wherein said fixed seats each are respectively provided with at least one positioning post and at least one fixing piece and said heat conduction space of said base has a surface thereof provided with at least one positioning hole and at least one fixing hole, which are used for embedding and fixing of said positioning posts and said fixing pieces of said fixed seats, said positioning posts and said positioning holes and said fixing pieces and said fixing holes being respectively selectively tip rods and tip holes, or tenons and mortise holes, or screw rods and screw holes.

6. The elastic heat conduction mechanism for electronic devices as claimed in claim 1, wherein said preset heating element accommodated in said accommodating space of said base is selectively an access device, a central processing unit (CPU), a chip or a microprocessor inside a preset electronic device.

7. The elastic heat conduction mechanism for electronic devices as claimed in claim 1, wherein said lifting adjustment members are respectively arranged at two sides of said wedges and respectively affixed to said fixed seats and are selectively springs, torsion springs, coil springs, reeds or hook rods with elastic force.

8. The elastic heat conduction mechanism for electronic devices as claimed in claim 1, wherein said heat-exchanging member is a heat sink, and a plurality of fins are provided on one side of said heat-exchanging member opposite to said storage space.

9. The elastic heat conduction mechanism for electronic devices as claimed in claim 1, wherein said heat-exchanging member is a casing of a preset electronic device.

\* \* \* \* \*